United States Patent [19]

Haque

[11] Patent Number: 4,853,759

[45] Date of Patent: Aug. 1, 1989

[54] INTEGRATED CIRCUIT FILTER WITH REDUCED DIE AREA

[75] Inventor: Yusuf A. Haque, San Jose, Calif.

[73] Assignee: American Microsystems, Inc., Santa Clara, Calif.

[21] Appl. No.: 188,190

[22] Filed: Apr. 28, 1988

Related U.S. Application Data

[63] Continuation of Ser. No. 912,645, Sep. 29, 1986, abandoned, which is a continuation of Ser. No. 622,414, Jun. 20, 1984, abandoned.

[51] Int. Cl.$^4$ .............................................. H01L 27/02
[52] U.S. Cl. .......................................... 357/51; 357/54; 357/14; 357/4; 364/724.03; 333/172
[58] Field of Search ................. 357/51, 14, 4, 54; 364/724; 333/172

[56] References Cited

U.S. PATENT DOCUMENTS

| | | | |
|---|---|---|---|
| 3,256,588 | 6/1966 | Sikina et al. | 333/172 X |
| 3,806,839 | 4/1974 | Iwakami | 333/172 X |
| 4,263,518 | 4/1981 | Ballatore et al. | 357/51 X |
| 4,366,455 | 12/1982 | Berger | 357/51 X |
| 4,399,417 | 8/1983 | Ballantyne et al. | 357/51 X |
| 4,442,500 | 4/1984 | Kongable et al. | 364/724 |

FOREIGN PATENT DOCUMENTS

| | | | |
|---|---|---|---|
| 0014310 | 8/1980 | European Pat. Off. | |
| 0165766 | 12/1985 | European Pat. Off. | 357/51 X |
| 52-55881 | 5/1977 | Japan | 357/51 X |
| 56-133863 | 10/1981 | Japan | 357/51 X |
| 59-17279 | 1/1984 | Japan | 357/51 X |
| 59-89450 | 5/1984 | Japan | 357/51 X |
| 2077496 | 12/1981 | United Kingdom | |

OTHER PUBLICATIONS

D. Johnson and J. Hilburn, "Rapid Practical Designs of Active Filters," John Wiley & Sons, pp. 12, 13 and 26–29 (1984) New York.

J. K. Howard, "Dual Dielectric Capacitor", IBM Technical Disclosure Bulletin, vol. 23, No. 3, Aug. 1980, p. 1058.

Primary Examiner—Andrew J. James
Assistant Examiner—William A. Mintel
Attorney, Agent, or Firm—Skjerven, Morrill, MacPherson, Franklin & Friel

[57] ABSTRACT

An electronic filter which has particular application for use as an antialiasing filter in sampled data systems fabricated so as to utilize high resistivity diffused regions (36, 37) within the semiconductor body (31), as opposed to low resistivity polycrystalline silicon resistors. Furthermore, the values of the resistors and capacitors selected for use in a filter constructed in accordance with this invention are such that the high resistivity resistors require a small amount of space, and are physically located beneath the capacitors (33, 34, 35) used in the filter of this invention. The lower plate (33) of the capacitor is connected to a fixed voltage potential, thereby in effect shielding the underlying resistors from the deleterious effect of changes in voltage, and thus preventing the modulation of the resistance values of the resistors.

5 Claims, 2 Drawing Sheets

INTEGRATED CIRCUIT FILTER WITH REDUCED DIE AREA

This application is a continuation of application Ser. No. 912,645, filed 9/29/86, now abandoned, which is a continuation of application Ser. No. 622,414, filed 6/20/84, now abandoned.

BACKGROUND OF THE INVENTION

This invention relates to the design and structure of electronic filters, and more particularly to an electronic filter implemented in an integrated circuit having a substantially reduced die area as compared with prior art filters.

Filters are well known in the prior art. Such filters serve as means for rejecting signals above a selected frequency (low pass filter), rejecting signals below a selected frequency (high pass filter), rejecting signals of a selected frequency (notch filter), or rejecting frequencies other than those within a predefined frequency range (band pass filter). Oftentimes, it is desirable to sample an analog signal; for example, for use in a sampled data system. Such sampled data systems are widespread and provide the advantages of allowing a digital circuit to perform analog functions. One of the problems associated with such sampled systems is known as "aliasing". Aliasing is the undesired effect that, in addition to passing selected frequencies within its desired pass band, a sampled data system will pass signals having a frequency near the sampling frequency.

FIG. 1 illustrates this aspect of aliasing. FIG. 1 shows a frequency domain graph of a sampled data system in which it is desired to pass audio signals within the frequency range of 0–3 khz. Thus, the filter characteristics are such as are shown on the left-hand side of FIG. 1. However, when the sampled data rate is 128 khz, the same transfer function is provided on both sides of 128 khz. Thus, signals within the range of $128 \pm 3$ khz are passed by the sampled data system. Further, these signals appear at the base band by virtue to being "mixed" with the 128 khz clock frequency. It is therefore desirable to eliminate the presence of such high frequency signals prior to being fed to the sampled data system. In this manner, although the sampled data system will have little or no attenuation of 125–131 khz signals, such signals will not be present in the input signal provided to the sampled data system, and thus are removed from the filter output. In order to accomplish this, oftentimes a low pass prefilter, or "antialiasing filter", is utilized to filter out such high frequency components of the input signal prior to applying the filtered input signal to the sampled data system. The graph of the transfer function of a typical antialiasing filter is shown superimposed on the graph of FIG. 1.

Such antialiasing filters are well known in the prior art and typically comprise a simple low pass filter. In many instances, a fair amount of attenuation is desired, and thus a two-pole filter is utilized. One such two-pole filter is shown in the schematic diagram of FIG. 2. Antialiasing filter 20 includes operational amplifier 26 having its inverting input terminal connected through resistor 27 to ground and also through resistor 28 to output terminal 29. The noninverting input terminal of operational amplifier 26 is connected through capacitor 25 to ground and through resistor 23 and resistor 22 to input terminal 21. The node between resistors 22 and 23 is connected through capacitor 24 to the output terminal of operational amplifier 26. The transfer function for the two-pole low pass filter 20 is as follows:

$$H(s) = \frac{V_{out}(s)}{V_{in}(s)} = G_1 b_0 / (s^2 + b_1 s + b_0),$$

where
$b_0 = 1/(R_{22}R_{23}C_{24}C_{25})$ $b_1 = [(1-G_1)/(R_{23}C_{25})] + 1/(R_{22}C_{24}) + 1/(R_{23}C_{24})$ $G_1 = 1 + R_{28}/R_{27}$ where
$H(s)$ = The transfer function of antialiasing filter 20;
$R_{22}$ = the resistance of resistor 22;
$R_{23}$ = the resistance of resistor 23;
$R_{27}$ = the resistance of resistor 27;
$R_{28}$ = the resistance of resistor 28;
$C_{24}$ = the capacitance of capacitor 24;
$C_{25}$ = the capacitance of capacitor 25; and
$G_1$ = the closed loop gain of operational amplifier 26.

In practice, the values of resistors 22, 23, 27 and 28 and capacitors 24 and 25 are selected according to well-known principles, such as are stated in "Rapid Practical Design of Active Filters" by D. E. Johnson and J. L. Hilburn, John Wiley & Son, (particularly pages 12, 13 and 27–29), which is hereby incorporated by reference.

Oftentimes, it is desired to fabricate an entire sampled data system as a single integrated circuit device. In this case, it is possible to provide an antialiasing filter as shown in FIG. 2 external to the integrated circuit, although this is undesirable. Therefore, it is desirable to fabricate the sampled data system, together with one or more antialiasing filters such as the antialiasing filter 20 of FIG. 2, as part of the same integrated circuit. While this has been done, the fabrication of such antialiasing filter 20 in FIG. 2 on an integrated circuit requires a considerable amount of die area, particularly when it is recognized that oftentimes a single sampled data integrated circuit requires four or more such antialiasing filters to be fabricated on the single integrated circuit chip. Prior art techniques for fabricating such antialiasing filters utilize portions of the polycrystalline silicon interconnect layer as resistors 22, 23, 27 and 28. While the use of polycrystalline silicon resistors is well known, and easily implemented in order to fabricate the antialiasing filter 20 of FIG. 2, the use of polycrystalline silicon resistors requires a substantial amount of die area. Polycrystalline silicon resistors typically have a resistance of approximately 20 ohms per square. Typically resistor values needed are within the range of approximately 50K $\Omega$ to 400K $\Omega$. Using polycrystalline silicon requires a large number of squares (for example, 1 square of polycrystalline silicon may be designed to be 8 microns square); further, resistors are spaced at least 5 microns apart and thus require a large area. Table 1 shows an approximate area calculation for a voice band filter having a closed loop gain of unity. Thus, the prior art antialiasing filter 20 of FIG. 2, fabricated on an integrated circuit device utilizing prior art techniques including the use polycrystalline silicon resistors, and allowing approximately 10% additional area for proper spacing and interconnection, requires approximately 1730 sq. mils per antialiasing filter. This is a substantial amount of integrated circuit device area, and substantially limits the number of integrated circuits which may be formed on a single semiconductor wafer. As is well known, the smaller the die area required for an integrated circuit, the more integrated circuits may be fit onto a single semiconductor wafer, and the greater number of finished integrated circuits possible for a given amount of semiconductor processing. This, of course, decreases the cost of each finished integrated circuit device.

SUMMARY

In accordance with the teachings of this invention, an electronic filter is provided which has particular application for use as an antialiasing filter in sampled data systems. The filter of this invention is fabricated so as to utilize high resistivity diffused regions within the semiconductor body, as opposed to low resistivity polycrystalline silicon resistors. Furthermore, in one embodiment of this invention the values of the resistors and capacitors selected for use in a filter constructed in accordance with this invention are such that the high resistivity resistors require a small amount of space and are physically located beneath the capacitors used in the filter of this invention. In accordance with the teachings of this invention, the lower plate of the capacitor is connected to a fixed voltage potential, thereby in effect shielding the underlying resistors from the deleterious effect of changes in voltage, and thus preventing the modulation of the resistance values of the resistors located beneath the capacitor. In this manner, the resistance values are highly constant.

DETAILED DESCRIPTION

In accordance with the teachings of this invention, a filter is designed in such a manner that the resistors required are fabricated of relatively high resistivity diffused areas within a semiconductor body, rather than the relatively low resistivity polycrystalline silicon resistors utilized in the prior art or relatively low resistivity diffused resistors utilized in the prior art. For example, polycrystalline silicon resistors typically have a resistance of approximately 20 ohms per square, which is significantly less than the resistivity of the high resistivity diffused regions utilized as resistors in accordance with the teachings of this invention, which have resistivities of approximately 2000 ohms per square. Accordingly, the use of such higher resistivity resistors allows an integrated circuit areas savings for the formation of resistors of approximately 100-fold.

While the use of this invention contemplates the fabrication of resistors of diffused regions having relatively high resistivities within a semiconductor body, it is also contemplated that this may be accomplished without the need for additional masking or doping steps. For example, in standard CMOS processing technology, well regions are formed having relatively high resistivities. By suitable masking techniques, the high resistivity resistors fabricated in accordance with the teachings of this invention are fabricated simultaneously with the fabrication of such well regions, thereby not requiring any additional masking or doping steps.

Figure 1:
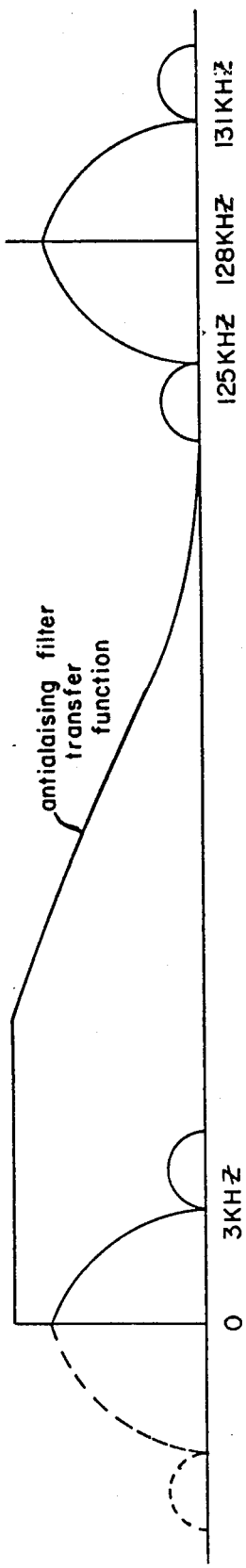
FIG. 1 is a plot of the frequency versus attenuation of a typical sampled data system.
Figure 3A:
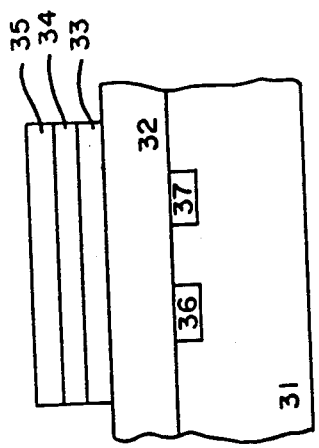
FIG. 3a is a cross-sectional view of the resistors and capacitors formed in accordance with the teachings of this invention in order to fabricate a filter in accordance with the teachings of this invention.

Also, in accordance with the teachings of this invention, the resistance values themselves and the capacitance values are selected such that the resistors may be located in the area beneath the capacitors. In this manner, since there is generally no active devices formed beneath the capacitors formed on an integrated circuit, a significant savings in die area is achieved. Referring to FIG. 3a, the cross-sectional view of a portion of an integrated circuit including resistor diffusions 36 and 37, within semiconductor body 31, is shown beneath the capacitor formed of plates 33 and 35 and interplate dielectric layer 34. Resistors 36 and 37 are insulated from plate 33 by insulation layer 32, which in one embodiment is field oxide having a thickness on the order of 10,000 Å. Not shown in FIG. 3a are small portions of resistor diffusions 36 and 37 which are used to provide electrical interconnection to resistor diffusions 36 and 37. These portions of resistor diffusions 36 and 37 can, if desired, extend out from beneath capacitor plate 33 to provide easy electrical connection to other circuit elements (now shown).

In accordance with the teachings of this invention, in one embodiment of this invention, the lower plate 33 is connected to ground (or any other suitable constant voltage) in order to effectively shield the resistance diffusions 36 and 37 from the undesirable effect of changing voltage levels. As is well known to those of ordinary skill in the art, the resistance of a lightly doped diffused region varies depending upon the voltages impressed upon it. In this manner, by utilizing the lower plate 33 as a reference plate, diffused resistance regions 36 and 37 are not influenced by various voltages in the integrated circuit device, and thus exhibit highly constant resistance values. This is particularly important because, if the resistor values are not constant, their resistance values are not linear with voltage and current, they may serve as multipliers and in effect provide harmonics of the signals passing through them. Thus, in one embodiment of this invention, the lower plate 33 of the capacitor shown in FIG. 3a corresponds to the lower plate of capacitor 25 shown in FIG. 2, which is connected to ground.

Figure 3B:
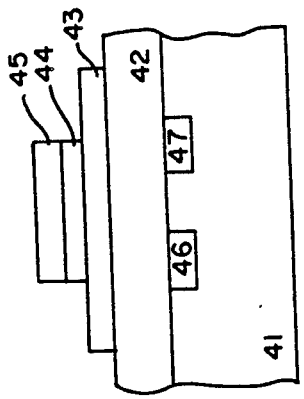
FIG. 3b is a cross-sectional view of another embodiment of the resistors and capacitors utilized in accordance with the teachings of this invention.

As has been previously described, it is desired that the resistance and capacitance values of the filter be selected such that the resistors may be fabricated beneath the capacitors and, preferably, that the resistors be fabricated beneath only those capacitors in the filter having their lower plate connected to ground or a fixed voltage level. However, in the event that this is not feasible, it is a further teaching of this invention that the lower plate be expanded in area in order to cover the underlying resistors. This is depicted in FIG. 3b as a cross-sectional view of a portion of an integrated circuit 40. The semiconductor body is shown as 41. Resistor diffusions are shown as regions 46 and 47; region 42 is an insulation layer such as field oxide as described previously in connection with FIG. 3a. The capacitor consists of an upper plate 45, a lower plate 43 and interplate dielectric layer 44. The lower plate 43 of the capacitor, which is connected to ground or a suitable reference voltage, is significantly larger than the upper plate 45. While the added area of the lower plate 43 has minimal effect on the capacitance value of the capacitor, it has great effect in shielding the underlying resistors.

It is believed that the fact that the underlying resistors are shielded by a top plate tied to a fixed voltage supply provides greater stability of the resistance values than would locating the resistors beneath an unused portion of the integrated circuit. In effect, the shielding properties of the lower plate of the capacitor serves to suppress any stray induced voltages on the underlying resistors. Therefore, in accordance with the teachings of one embodiment of this invention, a plate having a substantially fixed voltage impressed thereon is formed over and insulated from underlying diffused resistors in order to shield those resistors from spurious voltages created in other parts of the circuit. This plate is utilized even if it is not to serve as one plate of a capacitor.

Figure 2:
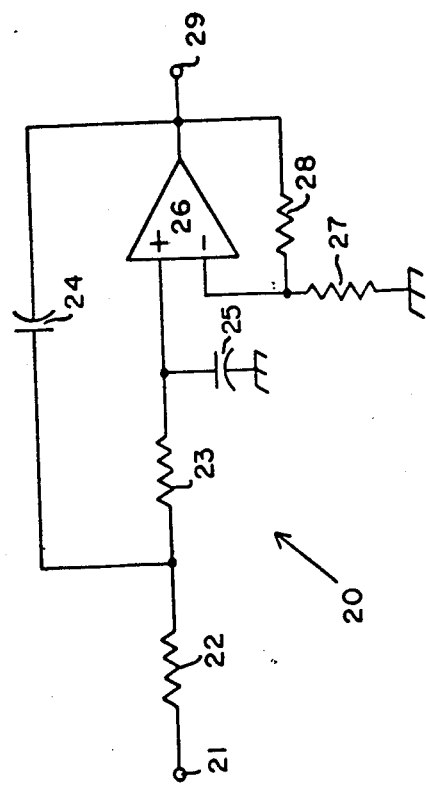
FIG. 2 is a schematic diagram of a typical low pass filter which is suitable for use as an antialiasing filter in sample data systems.

In accordance with the teachings of this invention, the low pass antialiasing filter of FIG. 2 was constructed having substantially the same transfer characteristic as in the prior art example set out in Table 1. However, the resistance values of resistors 22, 23, 27 and 28 were selected such that they conveniently are located beneath the lower plate of capacitor 25. In this embodiment of the low pass antialiasing filter constructed in accordance with my invention, the resistance and capacitance values and sizes are given as shown below in Table 2, where the resistances of resistors 27 and 28 are selected such that the closed loop gain of operational amplifier 26 is unity. The resistance and capacitance values and sizes in an alternative embodiment of this invention, where the resistances of resistors 27 and 28 are selected such that the closed loop gain of operational amplifier 26 is equal to four, is shown in Table 3.

As shown by the results given in Tables 2 and 3, filters fabricated in accordance with the teachings of this invention are fabricated utilizing significantly less integrated circuit die area than comparable filters constructed in accordance with prior art techniques.

The specific embodiments of invention described in this specification are intended to serve by way of example and are not a limitation on the scope of my invention. Numerous other embodiments of this invention will become apparent to those of ordinary skill in the art in light of the teachings of this specification.

TABLE 1

| COMPONENT | APPROXIMATE VALUE | APPROXIMATE INTEGRATED CIRCUIT AREA |
|---|---|---|
| Resistor 22 | 60k Ω | 312,000 square microns |
| Resistor 23 | 60k Ω | 312,000 square microns |
| Resistor 27 | ∞ | 0 |
| Resistor 28 | 0 | 0 |
| Capacitor 24 | 68.6 pf | 137,104 square microns |
| Capacitor 25 | 34.3 pf | 68,552 square microns |
| Oper. Amp. 26 | | 154,000 square microns |
| TOTAL | | 983,656 square microns = 1,574 square mils |

This does not include approximately 10% additional area required for electrical interconnection and proper spacing between components.

TABLE 2

| COMPONENT | APPROXIMATE VALUE | APPROXIMATE INTEGRATED CIRCUIT AREA |
|---|---|---|
| Resistor 22 | 146k Ω | 18,700 square microns |
| Resistor 23 | 262k Ω | 36,000 square microns |

TABLE 2-continued

| COMPONENT | APPROXIMATE VALUE | APPROXIMATE INTEGRATED CIRCUIT AREA |
|---|---|---|
| Resistor 27 | ∞ | 0 |
| Resistor 28 | 0 | 0 |
| Capacitor 24 | 71.4 pf | 142,850 square microns |
| Capacitor 25 | 23.6 pf | 47,140 square microns |
| Oper. Amp. 26 | | 154,000 square microns |
| TOTAL | | 398,690 square microns = 638 square mils |
| OR, by placing resistors 22, 23, 27 and 28 beneath capacitor 25 | | 343,990 square microns = 550 square mils |

This does not include approximately 10% additional area required for electrical interconnection and proper spacing between components.

TABLE 3

| COMPONENT | APPROXIMATE VALUE | APPROXIMATE INTEGRATED CIRCUIT AREA |
|---|---|---|
| Resistor 22 | 158k Ω | 20,000 square microns |
| Resistor 23 | 385k Ω | 50,000 square microns |
| Resistor 27 | 15k Ω | 1,900 square microns |
| Resistor 28 | 60k Ω | 7,600 square microns |
| Capacitor 24 | 23.8 pf | 47,637 square microns |
| Capacitor 25 | 47.6 pf | 95,274 square microns |
| Oper. Amp. 26 | | 154,000 square microns |
| TOTAL | | 376,411 square microns = 602 square mils |
| OR, by placing resistors 22, 23, 27 and 28 beneath capacitor 25 | | 296,911 square microns = 475 square mils |

This does not include approximately 10% additional area required for electrical interconnection and proper spacing between components.

I claim:

1. A semiconductor structure comprising:
    a semiconductor substrate of first conductivity type;
    a resistor formed within said substrate, said resistor being a diffused region, said diffused region being of a second conductivity type opposite said first conductivity type;
    an insulation layer formed above said resistor; and
    a nonparasitic capacitor formed on said insulation layer above said resistor diffusion, said capacitor having a first capacitive plate formed on said insulation layer, said first capacitive plate substantially covering said resistor diffusion, a dielectric layer formed on said first capacitive plate, and a second capacitive plate formed on said dielectric layer, said first and second capacitive plates being of respective areas to provide a desired capacitance.

2. The structure as in claim 1 wherein said first capacitive plate has a larger area than said second capacitive plate.

3. A filter in a semiconductor body comprising in combination:
    an operational amplifier means for filtering out selected frequency components of an input signal, said operational amplifier having an input and an output terminal;
    first and second resistors formed as first and second diffused regions within said semiconductor body, said first and second resistors each having first and second terminals, the first terminal of said first resistor comprising the input of said filter;

an insulation layer formed above said first and second resistors;

a first nonparasitic capacitor having a first capacitive plate, formed above said insulation layer, said first capacitive plate substantially covering said resistors, a second capacitive plate formed above said first capacitive plate, said first and second capacitive plates being of respective areas to provide a desired capacitance, and an interplate dielectric layer interposed between said first capacitive plate and said second capacitive plate;

means connecting said second capacitive plate and said second terminal of said second resistor to said input of said operational amplifier;

means connecting said first terminal of said second resistor to said second terminal of said first resistor;

second capacitor means having a first and second terminal;

means connecting said first terminal of said second capacitor means to said second terminal of said first resistor; and means connecting said second terminal of said second capacitor means to said output of said operational amplifier.

4. The structure as in claim 3 wherein said first capacitive plate has an area greater than the area of said second capacitive plate.

5. The structure as in claim 1 or 3, wherein said first capacitive plate is connected to a fixed voltage potential.

* * * * *